United States Patent
Goldfarb

(10) Patent No.: US 8,179,196 B2
(45) Date of Patent: May 15, 2012

(54) HIGH VOLTAGE AMPLIFICATION USING LOW BREAKDOWN VOLTAGE DEVICES

(75) Inventor: Marc Goldfarb, Atkinson, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/473,697

(22) Filed: May 28, 2009

(65) Prior Publication Data

US 2010/0301943 A1    Dec. 2, 2010

(51) Int. Cl.
  *H03F 3/16* (2006.01)
(52) U.S. Cl. ........................................ 330/277; 330/251
(58) Field of Classification Search .................. 330/251, 330/10, 207 A, 296–297, 285, 277
  See application file for complete search history.

(56) References Cited

U.S. PATENT DOCUMENTS

| | | | |
|---|---|---|---|
| 4,980,810 A | 12/1990 | McClanahan et al. | |
| 5,121,084 A | 6/1992 | Anderson et al. | |
| 5,867,061 A | 2/1999 | Rabjohn et al. | |
| 6,650,180 B2 | 11/2003 | Lautzenhiser et al. | |
| 6,683,499 B2 | 1/2004 | Lautzenhiser et al. | |
| 6,690,238 B2 | 2/2004 | Lautzenhiser et al. | |
| 6,747,517 B2 | 6/2004 | Lautzenhiser et al. | |
| 6,900,696 B2 | 5/2005 | Lautzenhiser et al. | |
| 6,922,106 B2 | 7/2005 | Lautzenhiser et al. | |
| 7,053,718 B2 | 5/2006 | Dupuis et al. | |
| 7,190,229 B1 | 3/2007 | Lautzenhiser et al. | |
| 7,215,206 B2 | 5/2007 | Dupuis et al. | |
| 7,570,116 B2 * | 8/2009 | Haila et al. | 330/264 |
| 7,944,307 B2 | 5/2011 | Goldfarb et al. | |
| 2007/0194804 A1 * | 8/2007 | Kase et al. | 326/27 |
| 2008/0024229 A1 | 1/2008 | Dupuis et al. | |

FOREIGN PATENT DOCUMENTS

| CA | 2374784 | 6/2003 |
|---|---|---|
| CA | 2374794 | 6/2003 |

* cited by examiner

*Primary Examiner* — Hieu Nguyen
(74) *Attorney, Agent, or Firm* — Knobbe Martens Olson & Bear LLP

(57) ABSTRACT

Methods and apparatus for amplifying signals over a wide frequency range to generate high voltage outputs feature a pair of switching modules which are connected in series. Switching modules, e.g., field-effect transistors (FETs), operate based on the voltage difference between an amplified signal and a fixed DC signal at two of their terminals, thereby generating an output waveform that has peak-to-peak voltage higher than, e.g. twice, the breakdown voltage of the transistors within the amplifier. The DC signals applied at the switching modules may be varied using an AC signal to improve the risetime of the output waveform and achieve a faster operational speed of the amplifier.

32 Claims, 2 Drawing Sheets

HIGH VOLTAGE AMPLIFICATION USING LOW BREAKDOWN VOLTAGE DEVICES

FIELD OF THE INVENTION

The present invention relates to high voltage amplification using devices with low breakdown voltage values.

BACKGROUND OF THE INVENTION

Modern communication systems require components, such as a local oscillator (LO) amplifier, which operate in the radio frequency (RF) spectrum and drive other components, e.g., mixers, modulators, and demodulators. However, the compression point of a passive FET mixer is directly related to the amplitude of the local oscillator. The ability of the local oscillator to generate a high, limited voltage output over a wide band of RF frequencies is usually limited by the breakdown voltages of the devices used in the implementation of the local oscillator. Moreover, the generation of such high voltage LO outputs may result in degraded risetime of the output waveform.

There is, accordingly, a need for an amplifying method or apparatus that produces an output waveform with high voltages, e.g., on the order of twice, thrice, or any integral multiple of the breakdown voltage of the component devices, without degrading the risetime of the output waveform.

SUMMARY OF THE INVENTION

In accordance with embodiments of the present invention, the problems of obtaining an amplified output waveform with peak-to-peak voltage exceeding the breakdown voltage of the component devices used in the amplifiers, without sacrificing the risetime of the output waveform are addressed by using a pair of switching modules connected in series. Switching modules, e.g., field-effect transistors (FETs), operate based on the voltage difference between an amplified signal and a fixed DC signal at two of their terminals, thereby generating an output waveform that has peak-to-peak voltage higher than the breakdown voltage of the component devices used in the amplifier. The DC signals applied at the switching modules may be varied using an AC signal to improve the risetime of the output waveform and achieve a faster operational speed of the amplifier. In various embodiments, apparatus and methods pertaining to this invention may be used in an RF communication system for amplifying signals over a wide range of frequencies, and enable lower breakdown voltage devices to be used in such systems, thereby permitting the output waveform to have a peak-to-peak voltage higher than the breakdown voltage of an individual device. The amplified signals may be used to drive various components of a communication system, such as a mixer, a modulator, or a demodulator.

Accordingly, in one aspect, the invention pertains to a method of amplifying signals. The method includes applying a first DC signal and a first AC signal varying within a first voltage range at two different terminals of a first switching module. Similarly, a second DC signal and a second AC signal within a second voltage range are applied at two different terminals of a second switching module. The second voltage range may include values less than or equal to the voltage values of the first voltage range. In one embodiment, the first and the second switching module are connected in series using their third terminals. An output signal is obtained from the series-connected switching modules, wherein the output signal may vary between the highest voltage value of the first range and the lowest voltage value of the second range. The output signal is generated from the first and second switching modules in response to the voltage differences between the first DC signal and the first AC signal, and between the second DC signal and the second AC signal. In one embodiment, these differences are compared with threshold voltages of the switching modules to generate the desired output.

In one embodiment, the first AC signal and second AC signals are received at the first and second switching modules from inverter amplifiers. In one embodiment, the peak-to-peak voltage of the output signal is greater than, e.g. twice, the breakdown voltage of the transistors in the inverter amplifiers. In another embodiment, the first and second AC signals received from the inverter amplifiers are in-phase.

In various embodiments, the first and second switching modules include a field effect transistor (FET). The first switching module may be a p-type FET, and the second switching module may be an n-type FET.

In one embodiment, the voltage at the first DC signal terminal at the first switching module is varied by using a 180 degree phase shifted version of the first AC signal. In the case where the first AC signal is received from an inverter amplifier, the 180 degree phase shifted version of the first AC signal is obtained from the input of the inverter amplifier through a DC blocking capacitor. In another embodiment, the voltage at the second DC signal terminal at the second switching module is varied by using a 180 degree phase shifted version of the second AC signal. In the case where the second AC signal is received from an inverter amplifier, the 180 degree phase shifted version of the second AC signal is obtained from the input of the inverter amplifier through a DC blocking capacitor.

In another aspect, the invention pertains to an apparatus for amplifying signals. The apparatus includes a first switching module including two different terminals for applying a first DC signal and a first AC signal varying within a first voltage range, and a second switching module including two different terminals for applying a second DC signal and a second AC signal varying within a second voltage range. In one embodiment, the second voltage range includes voltage values less than or equal to the voltage values of the first voltage range. The first switching module and the second switching module may be connected in series using their respective third terminals, and an output signal is obtained from the series-connected switching modules. The output signal may vary between the highest voltage value of the first range and the lowest voltage value of the second range. The output signal is generated from the first and second switching modules in response to the voltage differences between the first DC signal and the first AC signal, and between the second DC signal and the second AC signal. In one embodiment, these differences are compared with threshold voltages of the switching modules to generate the desired output.

In one embodiment, the first AC signal and second AC signals are received at the first and second switching modules from inverter amplifiers. In one embodiment, the peak-to-peak voltage of the output signal is greater than, e.g. twice, the breakdown voltage of the transistors in the inverter amplifiers. In another embodiment, the first and second AC signals received from the inverter amplifiers are in-phase.

In various embodiments, the first and second switching modules include a field effect transistor (FET). The first switching module may be a p-type FET, and the second switching module may be an n-type FET.

In one embodiment, the voltage at the first DC signal terminal at the first switching module is varied by using a 180 degree phase shifted version of the first AC signal. In the case where the first AC signal is received from an inverter amplifier, the 180 degree phase shifted version of the first AC signal is obtained from the input of the inverter amplifier through a DC blocking capacitor. In another embodiment, the voltage at the second DC signal terminal at the second switching module is varied by using a 180 degree phase shifted version of the second AC signal. In the case where the second AC signal is received from an inverter amplifier, the 180 degree phase shifted version of the second AC signal is obtained from the input of the inverter amplifier through a DC blocking capacitor.

The foregoing and other features and advantages of the present invention will be made more apparent from the description, drawings, and claims that follow.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DESCRIPTION OF THE INVENTION

In general, the present invention pertains in various embodiments to apparatus and methods for amplifying signals. To provide an overall understanding of the invention, certain illustrative embodiments are described, including apparatus and methods for amplifying and combining signals in, e.g. radio frequency (RF) range from about 10 MHz to about 5000 MHz, in a RF communication system by using series-connected switching modules.

Figure 1:
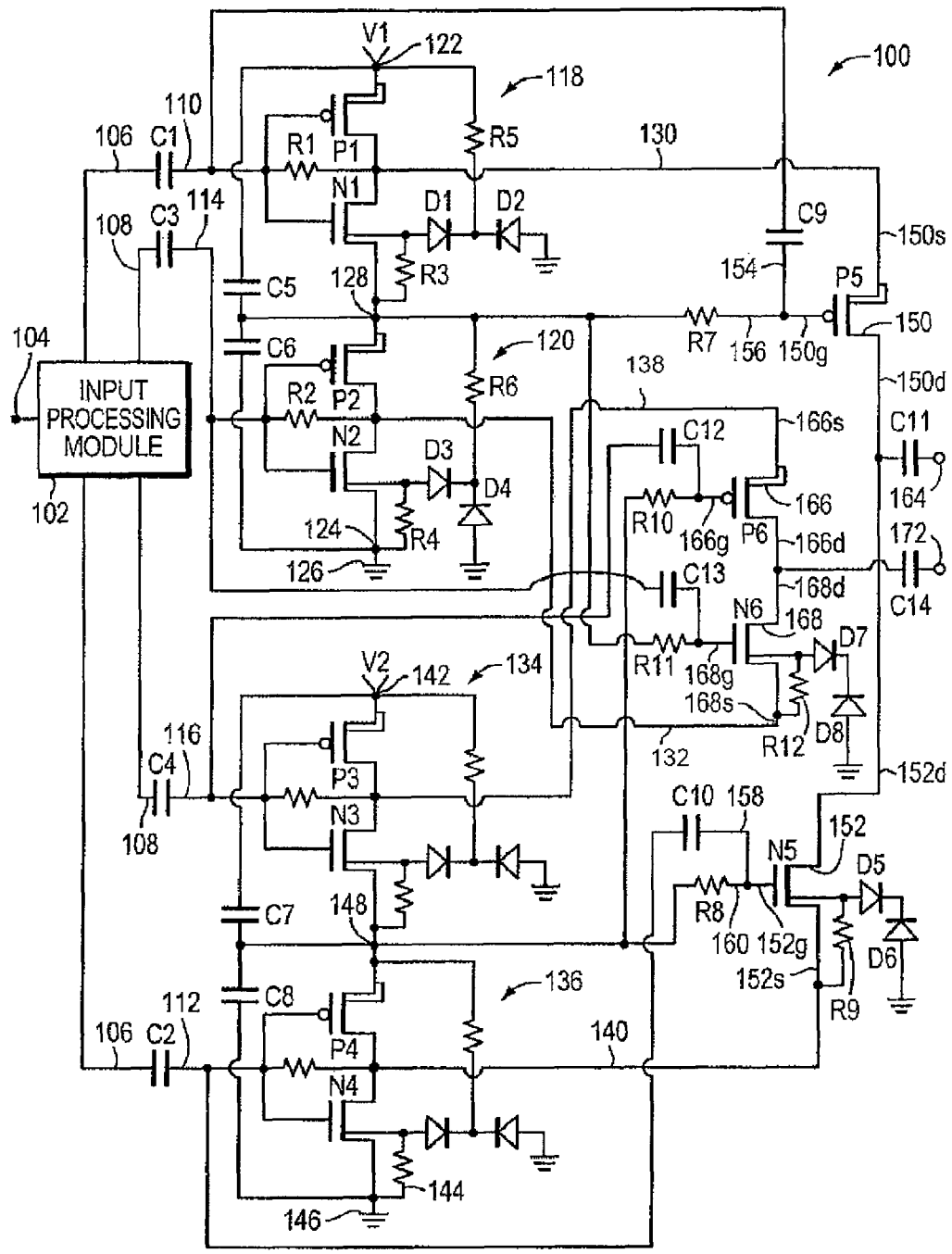
FIG. 1 is a schematic of an electronic apparatus according to an illustrative embodiment of the invention.

Refer to FIG. 1, which depicts an electronic apparatus 100 for amplifying signals according to an illustrative embodiment of the invention. The illustrated apparatus includes an input processing module 102 which may be configured to receive an input signal 104 and process it to generate a first signal 106 and a second signal 108.

In one embodiment, the input processing module 102 includes a differential amplifier. The differential amplifier may have two input terminals, with one terminal being connected to an electrical ground and the other terminal receiving the input signal 104, thus acting as single-ended to the differential amplifier. At its output, the differential amplifier generates the first signal 106 which may be in-phase with the input signal 104, and the second signal 108 which may be 180 degrees out-of-phase with the input signal 104. The differential amplifier may be a single stage or a two-stage amplifier, and may include bipolar junction transistors (BJTs), or field-effect transistors (FETs), or both. In another embodiment, the input processing module may contain only passive components such as resistors, capacitors, inductors, and transformers to achieve the same function.

In another embodiment, the input processing module 102 includes a splitter which receives the input signal 104 and splits it into the first signal 106 and the second signal 108, each having the same DC common mode voltage as provided by the input processing module 102. After DC filtering by capacitors C1, C2, the first signal 106 may include voltage values of the input signal 104 exceeding a predetermined voltage value, as measured at node 110, and may include voltage values of the input signal falling below the predetermined value at node 112, and, after DC filtering by capacitors C3, C4, the second signal 108 may include voltage values of the input signal 104 falling below the predetermined voltage value as measured at node 114, and may include voltage values of the input signal exceeding a predetermined voltage value as measured at node 116. In one embodiment, the predetermined voltage value is half of the supply voltage.

In one embodiment, the first signal 106 is coupled to a first amplifying module 118 through a coupling capacitor C1, and the second signal 108 is coupled to a second amplifying module 120 through a coupling capacitor C3. The coupling capacitors C1, C3 block any DC component in the signals 106, 108, thereby keeping the DC bias settings of the first amplifying module 118 and the second amplifying module 120 undisturbed. However, such coupling capacitors may suffer from degraded performance at low frequencies, and thus are required to have very high capacitance values which are difficult to fabricate on integrated circuits. Accordingly, in one alternative embodiment, the signals 106, 108 are coupled to the amplifying modules 118, 120 using transformers that, like capacitors, provide DC isolation.

In one embodiment, a voltage terminal 122 of the first amplifying module 118 is directly connected to a first DC voltage source V1, and a voltage terminal 124 of the second amplifying module 120 is connected to an electrical ground 126. In the same embodiment, the first and second amplifying modules 118, 120 are stacked, i.e., connected in series at terminal 128, between the first voltage source V1 and the electrical ground 126. Due to the stacking of the two amplifying modules, the voltage from the source V1 will be divided across the amplifying modules 118, 120 proportional to their overall impedance values. The DC current from the voltage source V1 may also be reduced and be reused between the amplifying modules 118, 120.

In one embodiment, both amplifying modules 118, 120 include an inverter amplifier with identical implementation, resulting in approximately equal impedance values of the modules 118, 120. The implementation and functioning of such an inverter amplifier is discussed in detail below.

The voltage produced by the first voltage source V1 may be divided approximately equally between the first amplifying module 118 and the second amplifying module 120. For example, if the voltage source V1 produces 5V, there may be approximately 2.5V voltage drop across each of the amplifying modules 118, 120. As the first amplifying module 118 is directly connected to the voltage source V1, it will be biased with the upper half of the total voltage drop, i.e., 2.5-5V, across the series combination. Accordingly, the first amplifying module 118 amplifies the first signal 106 to produce a first amplified signal 130 with a voltage swing that lies approximately between 2.5-5V.

In the same manner, the second amplifying module 120 is directly connected to the electrical ground 126 and is biased with the lower half of the total voltage drop, i.e., 0-2.5V. The second amplifying module 120 amplifies the second signal 108 to produce a second amplified signal 132 with a voltage swing which lies approximately between 0-2.5V. In some implementations, the voltage division is made precise by the presence of a large DC gain and substantial DC feedback in the first and second amplifying modules. This description anticipates implementations where the feedback can be generated using the same elements within the amplifying modules that provide AC gain, or through the use of ancillary circuitry.

In some implementations, the first voltage source V1 may supply an undesirable AC component along with the DC component, which may not allow the DC voltage across the amplifying modules 118, 120 to be divided proportionally and stay at a fixed value. Accordingly, to prevent such an AC component from affecting the voltage drop across the amplifying modules 118, 120, e.g., approximately half of the voltage from the source V1 as discussed above, a decoupling capacitor C5 is connected between the first voltage source V1 and node 128 and a decoupling capacitor C6 is connected between the node 128 and the electrical ground 126. Capacitors C5, C6 shunt the AC component from the voltage source V1 and stabilize the voltage drops across the amplifying modules 118, 120.

In a stacked amplifier structure as described above, for approximately equal voltage drops across each amplifying module, both the first and the second amplifying modules 118, 120 would be designed to have identical voltage swing at their respective outputs. However, because of various factors, including parasitic capacitances of the amplifying modules and the operation of each module in different voltage ranges (first amplifying module 118 range: 2.5-5V, and second amplifying module 120 range: 0-2.5V), in practice it has been found that gain imbalances are introduced in the stacked first and second amplified signals 130, 132. To compensate for this, in one embodiment, a third amplifying module 134 and a fourth amplifying module 136 are used.

Still referring to FIG. 1, the second signal 108 is coupled with the third amplifying module 134 through a capacitor C4 to produce a third amplified signal 138, and the first signal 106 is coupled with the fourth amplifying module 136 through a capacitor C2 to produce a fourth amplified signal 140. The capacitors C4, C2 play the same role of blocking DC as capacitors C1, C3. A voltage terminal 142 of the third amplifying module 134 is directly connected to a second DC voltage source V2, and a voltage terminal 144 of the fourth amplifying module 136 is connected to an electrical ground 146. Like the first and second amplifying modules 118, 120, the third and fourth amplifying modules 134, 136 are stacked with a series connection at node 148. In theory, any number of pairs of amplifying modules may be used in apparatus 100, but in practice the parasitic effects of various components may limit that number.

In one embodiment, the third and fourth amplifying modules 134, 136 are identical in implementation, and are identical to the first and second amplifying modules 118, 120, respectively. Accordingly, the voltage from the source V2 is divided approximately equally across the amplifying modules 134, 136. If the voltage produced by the second voltage source V2 is equal to the voltage from the source V1, then these modules have the same voltage drops as the amplifying modules 118, 120, i.e., 2.5V voltage drop, if V2, like V1, is producing 5V.

To stabilize this division of voltage, decoupling capacitors C7, C8 are connected between the second voltage source V2 and the node 148, and between the node 148 and the electrical ground 146. However, the fourth amplifying module 136 amplifying first signal 106, being diametrically opposite to the first amplifying module 118, operates and produces a voltage swing for the fourth amplified signal 140 in the lower range of the voltage from the source V2, e.g., between 0-2.5V. Similarly, the third amplifying module 134 amplifies the second signal 108, and unlike the second amplifying module 120, produces a voltage swing for the third amplified signal 138 in the higher range, between 2.5-5V, of the voltage source V2.

Also shown in FIG. 1 is the detailed construction of an embodiment of the stacked structures of the amplifying modules 118, 120, and of the amplifying modules 134, 136. In this embodiment, both the stacked structures are identical in construction. The stacked amplifying modules 118, 120 are implemented as inverter amplifiers, each including a PMOS and an NMOS transistor. In other embodiments, the inverter amplifiers include bipolar junction transistors (BJT). The source of the PMOS transistor P1 of the amplifier 118 is connected to the first DC voltage source V1, and the drain of the transistor P1 is connected to the drain of a NMOS transistor N1. The gates of the transistors P1, N1 receive the same signal, i.e., the first signal 106 after being passed through the blocking capacitor C1.

The amplifiers 118, 120 are stacked by connecting the source of the transistor N1 with the source of the PMOS transistor P2 of the amplifier 120. The drain of the transistor P2 is connected to the drain of the transistor N2, and the source of the transistor N2 is connected to the electrical ground 126. The gates of the transistors P2, N2 are provided the DC blocked second signal 108. As described above, the inverter amplifiers 118, 120 process the first and second signals 106, 108, and produce the first and second amplified output signals 130, 132.

In one embodiment, the inverter amplifiers 118, 120 each include a self-bias circuit including feedback resistors R1, R2. The feedback resistors R1, R2 improve the stability of the amplifiers 118, 120 by tackling the problem of change in operating current in the amplifier due to change in the ambient temperature. The feedback resistors R1, R2 maintain an almost fixed bias voltage at the amplifiers 118, 120. For example, if V1 provides 5V, the inverter amplifier 118 is self-biased at about half of its voltage drop of 2.5-5V, i.e., at approximately 3.75V, and the inverter amplifier 120 is self-biased at about half of its voltage drop of 0-2.5V, i.e., at approximately 1.25V.

In one embodiment, the transistors P1, N1, P2, N2 are fabricated using complementary MOSFET 0.25μ technology. As 0.25μ MOSFETs cannot operate at voltages greater than approximately 2.5V, it is important that the transistors are electrically isolated from the substrate to avoid catastrophic failure of the device. Various fabrication technologies, such as the deep N-well method or the triple well method may be used. Other isolation technologies such as silicon on insulator (SOI) technology may be used to fabricate the transistors in the amplifiers 118, 120.

Using deep N-well technology, NMOS transistors N1, N2 may be formed inside a P-doped well, which may itself be in an N-doped well. Alternately, both wells may be formed on a P-doped structure. Similarly, PMOS transistors may be formed inside a N-doped well. Due to the presence of P- and N-wells, there may be parasitic diodes formed at the P-N junctions. In one embodiment, for transistor N1, a diode D1 is formed from a P-doped well inside a N-doped well. A second diode D2 may be formed from the N-doped well and the P-doped substrate. In one embodiment, both diodes D1, D2 are reverse biased to prevent current flowing through them.

A resistor R3 is used to keep the DC level of the body contact of transistor N1 at its source potential. Diodes D3, D4 illustrate the parasitic components formed due to deep N-well implementation of the transistor N2. A resistor R4 is used to keep the DC level of the body contact of transistor N2 at its source potential. The resistor R5 connects the deep N-well to the source of P1 to maintain the deep n-well at a sufficiently high potential to keep it reverse biased. The resistor R6 similarly connects the deep N-well to the source of P2 to maintain the deep n-well at a sufficiently high potential to keep it reverse biased. In other embodiments, these resistors R5, R6 may be connected, either singly or together, directly to the most positive supply voltage.

As shown in FIG. 1, the stacked structure of the amplifying modules 134, 136 is identical to that of the amplifying modules 118, 120. Accordingly, the amplifying modules 134, 136 are implemented using PMOS and NMOS transistors P3, N3, P4, N4, and other identical components.

In another embodiment, amplifying modules, e.g., modules 118, 120, include multi-stage cascaded inverter amplifiers having two or more stages. This configuration may be used in applications where higher gains are desired across the apparatus 100. In such an embodiment, each stage of the inverter amplifiers is identical to the single-stage inverter amplifiers described above. Each stage may be connected to the same voltage source, e.g., the first voltage source V1, or to different voltage sources with different voltage values. The first stage of the multi-stage inverter amplifier 118 receives the DC blocked first signal 106 and processes it to produce a first intermediate signal. The second stage of the multi-stage inverter amplifier 118 receives the first intermediate signal as the input and processes it to produce the first amplified signal 130. Similarly, the first stage of the multi-stage inverter amplifier 120 produces a second intermediate signal, which is fed to the second stage of the multi-stage inverter amplifier 120 to produce the second amplified signal 132. Similar multi-stage implementations may be made for the amplifying modules 134, 136 to produce the third and fourth amplified signals 138, 140.

Still referring to FIG. 1, in one embodiment the first amplified signal 130 received from the inverter amplifier 118 (operating at a breakdown voltage of, e.g., 2.5V) and the fourth amplified signal 140 received from the inverter amplifier 136 (operating at a breakdown voltage of, e.g., 2.5V) are combined using a first switching module 150 and a second switching module 152 to obtain a combined signal 164 through a coupling capacitor C11. In another embodiment, the second amplified signal 132 received from the inverter amplifier 120 (operating with a breakdown voltage of, e.g., 2.5V) and the third amplified signal 138 received from the inverter amplifier 134 (operating with a breakdown voltage of, e.g., 2.5V) are combined using a third switching module 166 and a fourth switching module 168 to obtain a combined signal 172 through a coupling capacitor C14. Such combinations may cancel gain imbalances and asymmetries generated among the different sets of stacked amplifiers. In one embodiment, the first and third switching modules 150, 166, and the second and fourth switching modules 152, 168 have identical implementations. Accordingly, for clarity, we will only describe the implementation of the first and second switching modules 150, 152 in detail below.

In one embodiment, the first switching module 150 and the second switching module 152 are connected in series. As described above, the first amplified signal 130 may vary within a first voltage range, e.g., 2.5-5V, and the fourth amplified signal 140 may vary within a second voltage range, e.g., 0-2.5V, including voltage values less than or equal to the values in the first range. Moreover, because the first and fourth amplified signals 130, 140 are obtained from the inverter amplifiers 118, 136, both of which are fed the first signal 106 (after DC blocking through capacitors C1, C2), the signals 130, 140 may be in-phase. In one embodiment, the combined signal 164 varies within a voltage range that is higher than the breakdown voltages of the inverter amplifiers 118, 136. In the example described above, the combined signal 164 may vary between the highest voltage value of the first range, i.e. 5V, and the lowest voltage value of the second range, i.e., 0V. Accordingly, in this case, the peak-to-peak voltage of the combined signal 164 is 5V, which is twice the breakdown voltages, i.e., 2.5V, of the transistors within the inverter amplifiers 118, 136, and achieves this 5V value without exceeding the 2.5V across any one transistor.

In one embodiment, the first switching module 150 and the second switching module 152 may include a field-effect transistor (FET) which acts as a switch responsive to the comparison of the voltage difference between its gate and source, i.e., $V_{gs}$, and its threshold voltage, $V_t$. In one embodiment, the first switching module 150 is a p-type FET (PMOS). In another embodiment, the second switching module 152 is an n-type FET (NMOS). Diodes D5, D6 illustrate the parasitic components formed due to deep N-well implementation of the transistor 152. A resistor R9 is added to keep the DC level of the body contact of transistor 152 at its source potential.

As shown in FIG. 1, the first amplified signal 130 is coupled to the source 150s of the PMOS transistor 150, and the fourth amplified signal 140 is coupled to the source 152s of the NMOS transistor 152. The approximately equally divided and stabilized voltage drop of 2.5V between the inverter amplifiers 118, 120 at node 128 is coupled through a resistor R7 as a first DC signal to the gate 150g of the transistor 150. Similarly, the stabilized voltage drop of 2.5V between the inverter amplifiers 134, 136 at node 148 is coupled through a resistor R8 as a second DC signal to the gate 152g of the transistor 152. The drains 150d, 152d of the transistors 150, 152 are connected in series at a node 162. The combined signal 164 may be obtained at the node 162 through a coupling capacitor C11.

In operation, the transistors 150, 152 act as a switch and operate in the ON state depending on their $V_{gs}$ with respect to the their respective $V_t$. As is well known to a person of ordinary skill in the art, if the $V_{gs}$ of a PMOS transistor, e.g. transistor 150, is greater than or equal to $V_t$, e.g., $-0.6V$, the transistor will remain in the cut-off region and will not operate. A PMOS transistor will operate in the active region if $V_{gs} < V_t$. As is also well known to a person of ordinary skill in the art, if the $V_{gs}$ of an NMOS transistor, e.g., transistor 152, is less than or equal to $V_t$, e.g., 0.6V, the transistor will remain in the cut-off region and will not operate. An NMOS transistor will operate in the active region if $V_{gs} > V_t$.

In one embodiment, the PMOS transistor 150 receives the first amplified signal 130 varying within 2.5-5V at its source 150s and a DC signal 156 equal to 2.5V at its gate 150g. Accordingly, when the $V_{gs}$ of the transistor 150 is less than $V_t$, e.g., when the signal 130 is at 5V, $V_{gs} = -2.5V$ which is less than $V_t$, the transistor 150 operates in the ON state and outputs 5V. Similarly, when the signal 130 is at 2.5V, $V_{gs} = 0V$, which is greater than $V_t$, and therefore the transistor 150 will switch off. In the same embodiment and concurrently, the NMOS transistor 152 operates as a switch using the signal 140. The NMOS transistor 152 receives the fourth amplified signal 140 varying within 0-2.5V at its source 152s and a DC signal 160 equal to 2.5V at its gate 152g. Accordingly, when the $V_{gs}$ of the transistor 152 is greater than $V_t$, e.g., when the signal 140 is at 0V, $V_{gs} = 2.5V$, which is greater than $V_t$, the transistor 152 operates in the ON state and outputs 0V. Similarly, when the signal 140 is at 2.5V, $V_{gs} = 0V$, which is less than $V_t$, and therefore the transistor 152 will switch off. Therefore, the output signal 164 obtained through a coupling capacitor C11 at the connecting node 162 varies between 0-5V, which is twice the range of the first and fourth amplified signals 130, 140, and has a peak-to-peak voltage value equal to 5V, which is higher than the breakdown voltages of the inverter amplifiers 118, 120.

In one embodiment, the DC blocked first signal 106 is coupled at the gate 150g of the transistor 150 through a blocking capacitor C9 as a signal 154. Because, the signal 154 is taken from the input of the inverter amplifier 118, it has a phase difference of 180 degrees with respect to the first amplified signal 130. In another embodiment, the DC blocked first signal 106 is coupled at the gate 152g of the transistor 152 through a blocking capacitor C10 as a signal 158. Being taken at the input of the inverter amplifier 136, the signal 158 has a phase difference of 180 degrees with respect to the fourth amplified signal 140. The DC blocked signals 154, 158 assist in faster operation of the transistors 150, 152, respectively by varying the voltage values at their gates such that the necessary differences between their gates and sources are presented earlier as compared to the case where only DC signals are applied at the gates, and therefore, the transistors 150, 152 achieve their ON states faster. Using the "un-inverted" signals at the switching modules substantially improves the risetime of the output waveform of the signal 164.

Figure 2B:
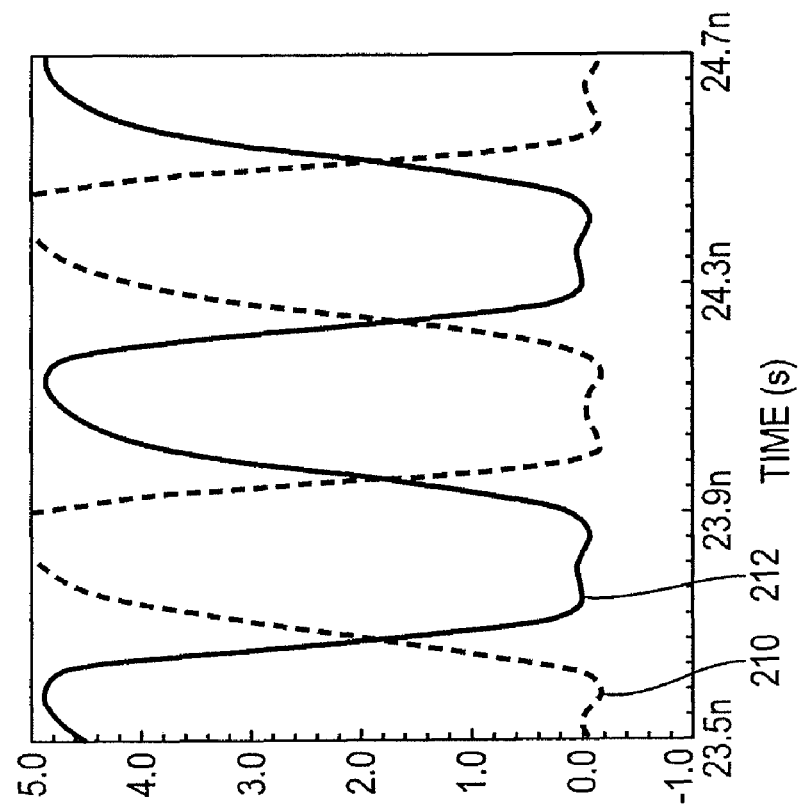
FIG. 2b is a graph illustrating signals at the output of the switching modules depicted in FIG. 1.
Figure 2A:
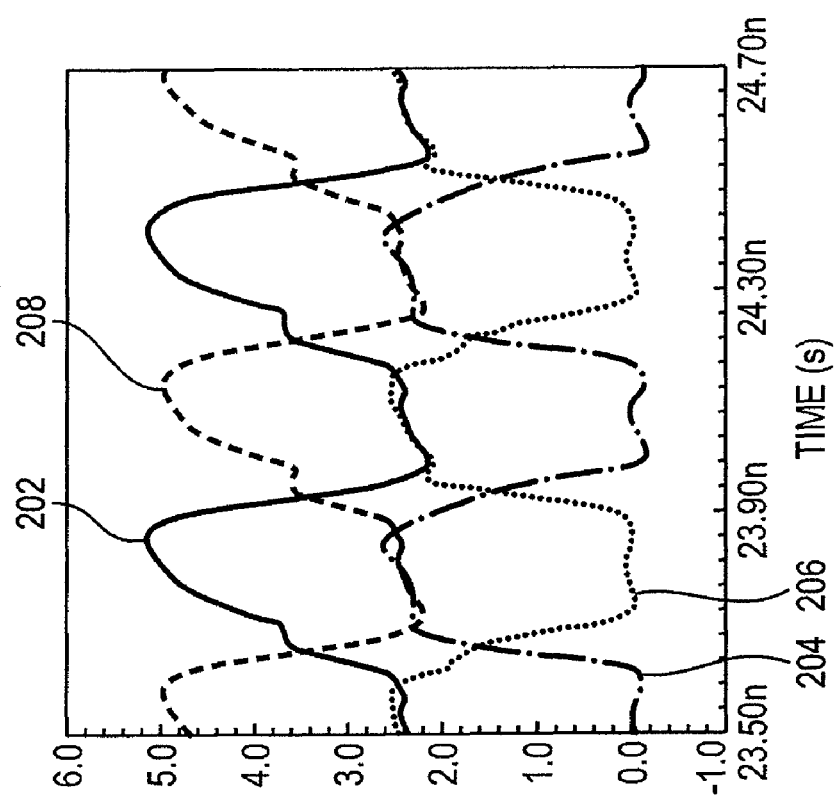
FIG. 2a is a graph illustrating signals at the output of the amplifying modules depicted in FIG. 1.

FIG. 2a plots the amplified signals 130, 132, 138, 140 at the output of the amplifying modules 118, 120, 134, 136 versus time for the embodiment of FIG. 1. Plots 202, 204 show the voltage swings between about 2.5-5V and about 0-2.5V for the first amplified signal 130 and the fourth amplified signal 140, respectively. Plots 206, 208 show the voltage swings between about 0-2.5V and about 2.5-5V for the second amplified signal 132 and the third amplified signal 138, respectively.

FIG. 2b plots the first and second output signals 164, 172 obtained at the outputs of the series-connected first and second switching modules 150, 152, and the series-connected third and fourth switching modules 166, 168, versus time. Plots 210, 212 show the output signals 164, 172 with an equal voltage swing of about 5V peak-to-peak, which is twice the breakdown voltages of the transistors in the inverter amplifiers 118, 120, 134, 136.

The terms and expressions employed herein are used as terms of description and not of limitation and there is no intention, in the use of such terms and expressions, of excluding any equivalents of the features shown and described or portions thereof, but it is recognized that various modifications are possible within the scope of the invention claimed. Additionally, this description generally relates to the implementation of this invention in silicon-based processes, however it is anticipated that the technique described herein can be easily implemented in other technologies such as GaAs, GaN, and others by a person of ordinary skill in the art.

What is claimed is:

1. A method of amplifying signals, the method comprising:
applying, at two different terminals of a first switching module, a first DC signal and a first AC signal varying within a first voltage range, wherein the first switching module comprises a first field effect transistor (FET) having a source, a drain, and a gate, wherein the first DC signal is applied to the gate of the first FET, wherein the first AC signal is applied to the source of the first FET;
applying, at two different terminals of a second switching module, a second DC signal and a second AC signal varying within a second voltage range, wherein the second voltage range includes voltage values less than or equal to the voltage values of the first voltage range, wherein the second switching module comprises a second field effect transistor (FET) having a source, a drain, and a gate, wherein the second DC signal is applied to the gate of the second FET, wherein the second AC signal is applied to the source of the second FET;
connecting the first switching module and the second switching module in series using their respective third terminals; and
obtaining an output signal from the connected switching modules, the output signal being responsive to the voltage difference between the first DC signal and the first AC signal, and to the voltage difference between the second DC signal and the second AC signal;
wherein the output signal varies between the highest voltage value of the first range and the lowest voltage value of the second range.

2. The method of claim 1 wherein the first AC signal and the second AC signal are in-phase.

3. The method of claim 1, wherein the first switching module is a p-type FET.

4. The method of claim 1, wherein the second switching module is an n-type FET.

5. The method of claim 1 further comprising receiving the first AC signal from an inverter amplifier.

6. The method of claim 1 further comprising receiving the second AC signal from an inverter amplifier.

7. The method of claim 1, further comprising applying a DC-blocked signal to the gates of a PMOS transistor and an NMOS transistor to generate the first AC signal, wherein the drains of the PMOS transistor and the NMOS transistor are electrically coupled to each other via a node, wherein the first AC signal is generated from the node.

8. The method of claim 7, further comprising applying the DC-blocked signal to a first end of a resistor, wherein the first end of the resistor is electrically coupled to the gates of the PMOS transistor and the NMOS transistor, wherein the resistor includes a second end electrically coupled to the node.

9. The method of claim 7, further comprising passing an input signal through a capacitor to generate the DC-blocked signal.

10. A method of amplifying signals, the method comprising:
applying, at two different terminals of a first switching module, a first DC signal and a first AC signal varying within a first voltage range;
applying, at two different terminals of a second switching module, a second DC signal and a second AC signal varying within a second voltage range, wherein the second voltage range includes voltage values less than or equal to the voltage values of the first voltage range;
connecting the first switching module and the second switching module in series using their respective third terminals; and
obtaining an output signal from the connected switching modules, the output signal being responsive to the voltage difference between the first DC signal and the first AC signal, and to the voltage difference between the second DC signal and the second AC signal;
wherein the output signal varies between the highest voltage value of the first range and the lowest voltage value of the second range,
wherein the method further comprises:
varying the voltage at the first DC signal terminal using a 180 degree phase shifted version of the first AC signal; and
varying the voltage at the second DC signal terminal using a 180 degree phase shifted version of the second AC signal.

11. The method of claim 10, wherein the 180-degree phase shifted version of the first AC signal is DC blocked.

12. The method of claim 10, wherein the 180-degree phase shifted version of the second AC signal is DC blocked.

13. A method of amplifying signals, the method comprising:
- applying, at two different terminals of a first switching module, a first DC signal and a first AC signal varying within a first voltage range;
- applying, at two different terminals of a second switching module, a second DC signal and a second AC signal varying within a second voltage range, wherein the second voltage range includes voltage values less than or equal to the voltage values of the first voltage range;
- connecting the first switching module and the second switching module in series using their respective third terminals; and
- obtaining an output signal from the connected switching modules, the output signal being responsive to the voltage difference between the first DC signal and the first AC signal, and to the voltage difference between the second DC signal and the second AC signal;
- wherein the output signal varies between the highest voltage value of the first range and the lowest voltage value of the second range,
- wherein the method further comprises receiving the first AC signal from an inverter amplifier,
- wherein a peak-to-peak voltage of the output signal is greater than a breakdown voltage of the transistors in the inverter amplifier.

14. A method of amplifying signals, the method comprising:
- applying, at two different terminals of a first switching module, a first DC signal and a first AC signal varying within a first voltage range;
- applying, at two different terminals of a second switching module, a second DC signal and a second AC signal varying within a second voltage range, wherein the second voltage range includes voltage values less than or equal to the voltage values of the first voltage range;
- connecting the first switching module and the second switching module in series using their respective third terminals; and
- obtaining an output signal from the connected switching modules, the output signal being responsive to the voltage difference between the first DC signal and the first AC signal, and to the voltage difference between the second DC signal and the second AC signal;
- wherein the output signal varies between the highest voltage value of the first range and the lowest voltage value of the second range,
- wherein the method further comprises receiving the second AC signal from an inverter amplifier,
- wherein a peak-to-peak voltage of the output signal is greater than a breakdown voltage of the transistors in the inverter amplifier.

15. An apparatus for amplifying signals, the apparatus comprising:
- a first switching module comprising a first field effect transistor (FET) including a gate for applying a first DC signal, a source for applying a first AC signal varying within a first voltage range, and a drain; and
- a second switching module comprising a second field effect transistor (FET) including a gate for applying a second DC signal, a source for applying a second AC signal varying within a second voltage range, and a drain, wherein the second voltage range includes voltage values less than or equal to the voltage values of the first voltage range,
- wherein the first switching module and the second switching module are connected in series using the drains of the first and second FETs, and an output signal is obtained from the series-connected switching modules; and
- wherein the output signal is responsive to the voltage difference between the first DC signal and the first AC signal, and to the voltage difference between the second DC signal and the second AC signal, and varies between the highest voltage value of the first range and the lowest voltage value of the second range.

16. The apparatus of claim 15 wherein the first AC signal and the second AC signal are in-phase.

17. The apparatus of claim 15, wherein the first switching module is a p-type FET.

18. The apparatus of claim 15, wherein the second switching module is an n-type FET.

19. The apparatus of claim 15, wherein the first AC signal is received from an inverter amplifier.

20. The apparatus of claim 15, wherein the second AC signal is received from an inverter amplifier.

21. The apparatus of claim 15, further comprising a PMOS transistor having a source, a drain, and a gate; and an NMOS transistor having a source, a drain, and a gate, wherein the gates of the PMOS transistor and the NMOS transistor are electrically coupled to each other via a first node, wherein the drains of the PMOS transistor and the NMOS transistor are electrically coupled to each other via a second node, wherein the first AC signal is generated from the second node.

22. The apparatus of claim 21, further comprising a resistor having a first end electrically coupled to the first node, and a second end electrically coupled to the second node.

23. The method of claim 21, further comprising a capacitor having a first terminal configured to receive an input signal, and a second terminal electrically coupled to the first node.

24. An apparatus for amplifying signals, the apparatus comprising:
- a first switching module including a first terminal for applying a first DC signal, a second terminal for applying a first AC signal varying within a first voltage range, and a third terminal; and
- a second switching module including a first terminal for applying a second DC signal, a second terminal for applying a second AC signal varying within a second voltage range, and a third terminal, wherein the second voltage range includes voltage values less than or equal to the voltage values of the first voltage range,
- wherein the first switching module and the second switching module are connected in series using their respective third terminals, and an output signal is obtained from the series-connected switching modules; and
- wherein the output signal is responsive to the voltage difference between the first DC signal and the first AC signal, and to the voltage difference between the second DC signal and the second AC signal, and varies between the highest voltage value of the first range and the lowest voltage value of the second range,
- wherein:
- the voltage at the first DC signal terminal is varied using a 180 degree phase shifted version of the first AC signal; and
- the voltage at the second DC signal terminal is varied using a 180 degree phase shifted version of the second AC signal.

25. The apparatus of claim 24 further comprising a first capacitor for DC blocking the 180-degree phase shifted version of the first AC signal.

26. The apparatus of claim 24 further comprising a second capacitor for DC blocking the 180-degree phase shifted version of the second AC signal.

27. An apparatus for amplifying signals, the apparatus comprising:
- a first switching module including a first terminal for applying a first DC signal, a second terminal for applying a first AC signal varying within a first voltage range, and a third terminal; and
- a second switching module including a first terminal for applying a second DC signal, a second terminal for applying a second AC signal varying within a second voltage range, and a third terminal, wherein the second voltage range includes voltage values less than or equal to the voltage values of the first voltage range,
- wherein the first switching module and the second switching module are connected in series using their respective third terminals, and an output signal is obtained from the series-connected switching modules; and
- wherein the output signal is responsive to the voltage difference between the first DC signal and the first AC signal, and to the voltage difference between the second DC signal and the second AC signal, and varies between the highest voltage value of the first range and the lowest voltage value of the second range,
- wherein the first AC signal is received from an inverter amplifier,
- wherein a peak-to-peak voltage of the output signal is greater than a breakdown voltage of the transistors in the inverter amplifier.

28. An apparatus for amplifying signals, the apparatus comprising:
- a first switching module including a first terminal for applying a first DC signal, a second terminal for applying a first AC signal varying within a first voltage range, and a third terminal; and
- a second switching module including a first terminal for applying a second DC signal, a second terminal for applying a second AC signal varying within a second voltage range, and a third terminal, wherein the second voltage range includes voltage values less than or equal to the voltage values of the first voltage range,
- wherein the first switching module and the second switching module are connected in series using their respective third terminals, and an output signal is obtained from the series-connected switching modules; and
- wherein the output signal is responsive to the voltage difference between the first DC signal and the first AC signal, and to the voltage difference between the second DC signal and the second AC signal, and varies between the highest voltage value of the first range and the lowest voltage value of the second range,
- wherein the second AC signal is received from an inverter amplifier,
- wherein a peak-to-peak voltage of the output signal is greater than a breakdown voltage of the transistors in the inverter amplifier.

29. A method for increasing the switching speed of a switching module, the method comprising:
- combining a DC signal and a first AC signal to generate a first control signal;
- inverting the first AC signal to generate a second control signal; and
- applying the first control signal and the second control signal to a DC signal terminal and an AC signal terminal, respectively, of the switching module;
- wherein the voltage at the DC signal terminal is varied from a DC level of the DC signal at least partially by the first AC signal;
- wherein the second control signal is 180 degree phase shifted from the first AC signal.

30. The method of claim 29, wherein the DC signal is about half of a power supply voltage.

31. The method of claim 29, wherein the switching module comprises a field effect transistor (FET), wherein the AC signal terminal corresponds to a source of the FET, and the DC signal terminal corresponds to a gate of the FET.

32. A method for increasing the switching speed of a switching module, the method comprising:
- applying, at two different terminals of a switching module, a DC signal and an AC signal; and
- varying the voltage at the DC signal terminal, using a 180 degree phase shifted version of the AC signal,
- wherein the 180-degree phase shifted version of the AC signal is DC blocked.

* * * * *